United States Patent [19]
Terry et al.

[11] Patent Number: 5,521,545
[45] Date of Patent: May 28, 1996

[54] COLLECTOR-INJECTION MIXER WITH RADIO FREQUENCY SIGNAL APPLIED TO COLLECTORS OF LOWER TRANSISTOR PAIR

[75] Inventors: Brian K. Terry, Parkland; Wei Tan, Lake Worth, both of Fla.

[73] Assignee: Motorola, Inc., Schaumburg, Ill.

[21] Appl. No.: 326,909

[22] Filed: Oct. 21, 1994

[51] Int. Cl.$^6$ .............................. H04B 1/28; G06G 7/02
[52] U.S. Cl. ..................... 327/359; 327/355; 327/356; 327/105; 327/113; 327/116; 455/330; 455/326
[58] Field of Search .................................. 327/113, 119, 327/116, 355, 356, 357, 359, 105, 350, 103; 455/326, 330, 333

[56] References Cited

U.S. PATENT DOCUMENTS

| | | | |
|---|---|---|---|
| 4,344,188 | 8/1982 | Tanabe et al. | 455/333 |
| 4,480,337 | 10/1984 | Graziadei et al. | 455/333 |
| 4,636,663 | 1/1987 | Jongepier et al. | 327/113 |
| 5,379,457 | 1/1995 | Nguyen | 327/113 |

*Primary Examiner*—Timothy P. Callahan
*Assistant Examiner*—Dinh J. Le
*Attorney, Agent, or Firm*—Kelly A. Gardner

[57] ABSTRACT

A collector-injector mixer circuit (100) has a first differential pair of transistors having first and second transistors (102, 104) whose emitters are connected to a common first emitter terminal (110), and a second differential pair of transistors having third and fourth transistors (106, 108) whose emitters are connected to a common second emitter terminal (112). The bases of the first and fourth transistors (102, 108) are coupled to a common first base terminal (114) and the bases of the second and third transistors (104, 106) are coupled to a common second base terminal (116) between which a mixing signal is applied. A third differential pair of transistors have fifth and sixth transistors (124, 126) wherein collector (130, 132) of the fifth transistor (124) and sixth transistor (126) receive an input signal, an emitter of the fifth and sixth transistors (124, 126) are coupled through resistors (146, 148) to ground, and bases of the fifth and sixth transistors are coupled to a reference current circuit (150).

6 Claims, 2 Drawing Sheets

COLLECTOR-INJECTION MIXER WITH RADIO FREQUENCY SIGNAL APPLIED TO COLLECTORS OF LOWER TRANSISTOR PAIR

FIELD OF THE INVENTION

This invention relates in general to mixer circuits and more particularly to a collector-injection mixer circuit with radio frequency signal applied to the collectors of a lower transistor pair.

BACKGROUND OF THE INVENTION

Double-balanced mixer circuits are most commonly used in radio or television receivers. This type of mixer circuit is particularly suitable for low power frequency modulation (FM) receiver integrated circuits such as the Philips TDA 7000, as described in Netherlands Patent Application No. 82.00.959, and the Philips UAA 2080, as described in U.S. patent application Ser. No. 4,636,663. In both the Philips TDA 7000 and UAA 2080, the radio frequency (RF) signal from the antenna is applied to the input of a voltage-to-current converter that amplifies the RF signal and applies the result in phase opposition to the common-emitter terminal of the first and second differential pairs. A local oscillator (LO) signal is applied to the first and second common-base terminals and the RF signal is mixed down to create the intermediate frequency (IF) signal.

The dynamic range of such a receiver depends almost entirely upon the dynamic range of the mixer. The dynamic range of a receiver is characterized as the difference between the threshold RF signal level for intelligible reception and the maximum intermodulation product signal level for which reception is not disturbed. The difference is also known as intermodulation rejection and is expressed in decibels (dBs). In such circuits as the TDA 7000 and the UAA 2080, it has been found that the quality of the mixer is primarily determined by the quality of the voltage-to-current converter.

In the TDA 7000, the voltage-to-current converter comprises a differential amplifier. It has been found that the noise, and more importantly, the intermodulation rejection of such a common-emitter differential amplifier is sufficiently good enough to meet the requirements of a circuit when used, for example, in a car radio. The intermodulation interference is caused by the non-linearity of the differential amplifier of the voltage-to-current converter.

In the UAA 2080, the voltage-to-current converter comprises a balanced, common-base circuit. The balanced common-base circuit has better linearity and consequently exhibits better intermodulation rejection than a differential amplifier. It has been shown that, although greatly improved over the differential amplifier, the intermodulation behavior of the balanced common-base circuit still does not meet the stringent requirements of the types of receivers used, for example, in a portable selective call receiver. Thus, what is needed is a mixer circuit that meets the stringent requirements of selective call receivers.

DESCRIPTION OF A PREFERRED EMBODIMENT

Figure 1:
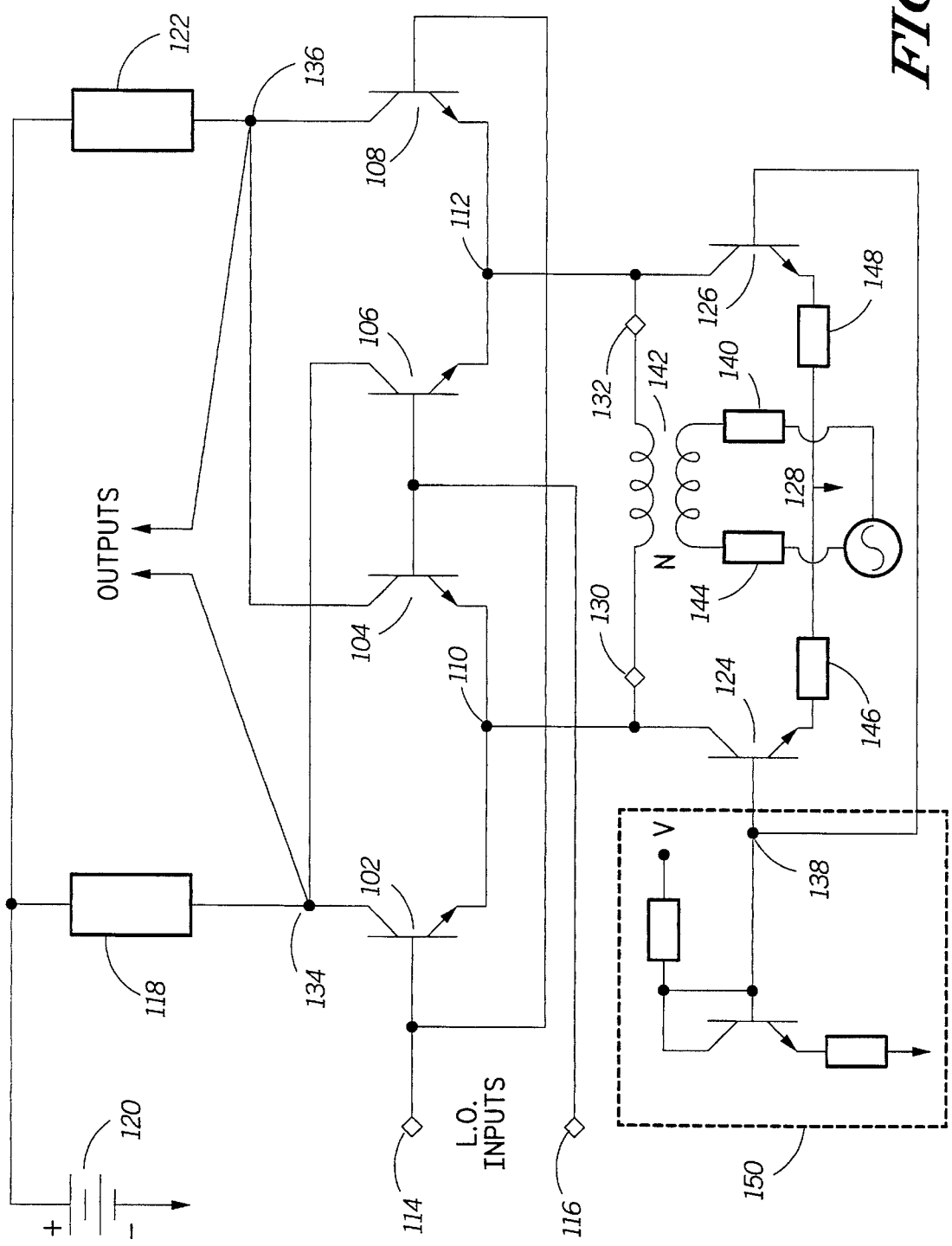
FIG. 1 is a schematic diagram of a collector-injection mixer circuit in accordance with the preferred embodiment of the present invention.

Referring to FIG. 1, a collector-injection mixer circuit is shown in accordance with the preferred embodiment of the present invention. The collector-injection mixer circuit 100 comprises two differential pairs of transistors 102, 104 and 106, 108 in the upper stage, and one differential pair of transistors 124, 126 in the lower stage. The emitters of transistors 102, 104 of the two differential pairs are connected in common at node 110, and the emitters of transistors 106, 108 of the two differential pairs are connected in common at node 112. The bases of transistors 102 and 108 are connected in common at node 114, and the bases of transistors 104 and 106 are connected in common at node 116. A differential local oscillator (LO) signal (not shown) is applied between nodes 114 and 116.

The collectors of transistors 102 and 106 are coupled together at node 134 and connected to a power supply 120 through impedance 118. The collectors of transistors 104 and 108 are also coupled together at node 136 and connected to the power supply 120 through impedance 122. Impedances 118 and 122 can be realized with either active devices and/or passive devices as is well known to one of ordinary skill in the art. The emitters of transistors 124 and 126 are connected to resistor 146 and resistor 148 respectively. The other terminals of resistors 146 and 148 are connected to ground 128. When a differential radio frequency (RF) signal via an RF signal source 300 between nodes 130 and 132, the mixer circuit 100 multiplies the LO signal (not shown but applied at nodes 114, 116) with the RF signal (applied at nodes 130, 132 which is electrically the same as nodes 110, 112) to produce signals representing the sums and differences between the two frequencies of the LO signal and RF signal, appearing as output signals at nodes 134 and 136.

The portion of the output signals that contains the difference between the frequency of the LO signal and the frequency of the RF signal is known as the intermediate frequency (IF) signal, and can be obtained by use of a band-pass or a low-pass filter as is well known to one of ordinary skill in the art.

Transistors 124, 126 operate as collector-injection mixer transistors as well as direct current (DC) sinks. The bases of transistors 124, 126 are coupled together in common at node 138. Node 138 is further coupled to a reference current circuit 150 which provides an identical base-emitter voltage to transistors 124, 126, allowing equal direct current (DC) to flow from collector to emitter of each of the transistors 124, 126.

On the other hand, if the mixer circuit being described was a common-base or common-emitter type, the RF signal voltage would have to undergo a voltage-to-current conversion and, therefore would be superimposed as a current on the emitter currents of the differential pairs. The additional voltage-to-current conversion step, that is necessary in either the common-base or common-emitter mixer circuit introduces more non-linearity into the mixer circuit. This additional step is eliminated in the collector-injection mixer circuit 100 described in FIG. 1.

The RF signal and LO signal should each be applied to the mixer circuit 100 in phase opposition, and if the RF signal is applied by a floating source, this source may be arranged directly between nodes 130 and 132.

According to the preferred embodiment of the present invention, a transformer 142 is coupled to the differential output of the previous stage. One advantage of using the transformer 142 is that the RF signal source impedances 140, 144 can be matched by adjusting the turns ratio, N, of the transformer 142 to reduce noise figure and increase linearity.

Those of ordinary skill in the art of circuit theory and double-balanced mixer circuits would not think of injecting a signal into the collector of the lower differential pair of transistor 124, 126 because typical double-balanced mixer circuits require higher gain and therefore operate at higher current levels, e.g., typically ten times greater than that required for a paging application. In the typical high current operation of the double-balanced mixer circuit, no appreciable signal would appear on the nodes 130, 132 because of internal impedance. Conversely, in the paging applications, since the operating currents are typically ten times smaller the signal, albeit reduced, the signal appearing at nodes 130, 132 is suitable for the lower signal requirement of the paging application.

In this way, when the RF signal is applied to collectors 130, 132 of the differential pair of transistors 124, 126, the collector-injection mixer circuit 100 produces an output signal at nodes 134, 136 without introducing nonlinearity that is typical of the common-base or the common-emitter type double-balanced configurations because, with the collector-injection mixer circuit, a voltage-to-current conversion step is unnecessary. Those of ordinary skill in the art will appreciate that a common-base or common-emitter configuration necessitates a voltage-to-current conversion step that introduces the undesirable non-linearity. This undesirable non-linearity eliminated in the collector-injection mixer circuit 100.

Accordingly, the preferred embodiment of the present invention provides a mixer circuit that shows improved intermodulation behavior over known common-base or common-emitter double-balanced topologies, and a mixer circuit that can demonstrate the improved behavior when operating from a supply voltage of one (1) volt. The collector-injection mixer described exhibits improved linearity due to the fact that the radio frequency signal is not applied to a voltage-to-current conversion stage prior to the mixing with the local oscillator signal but is differentially applied to the collectors of the lower differential pair of transistors.

Figure 2:
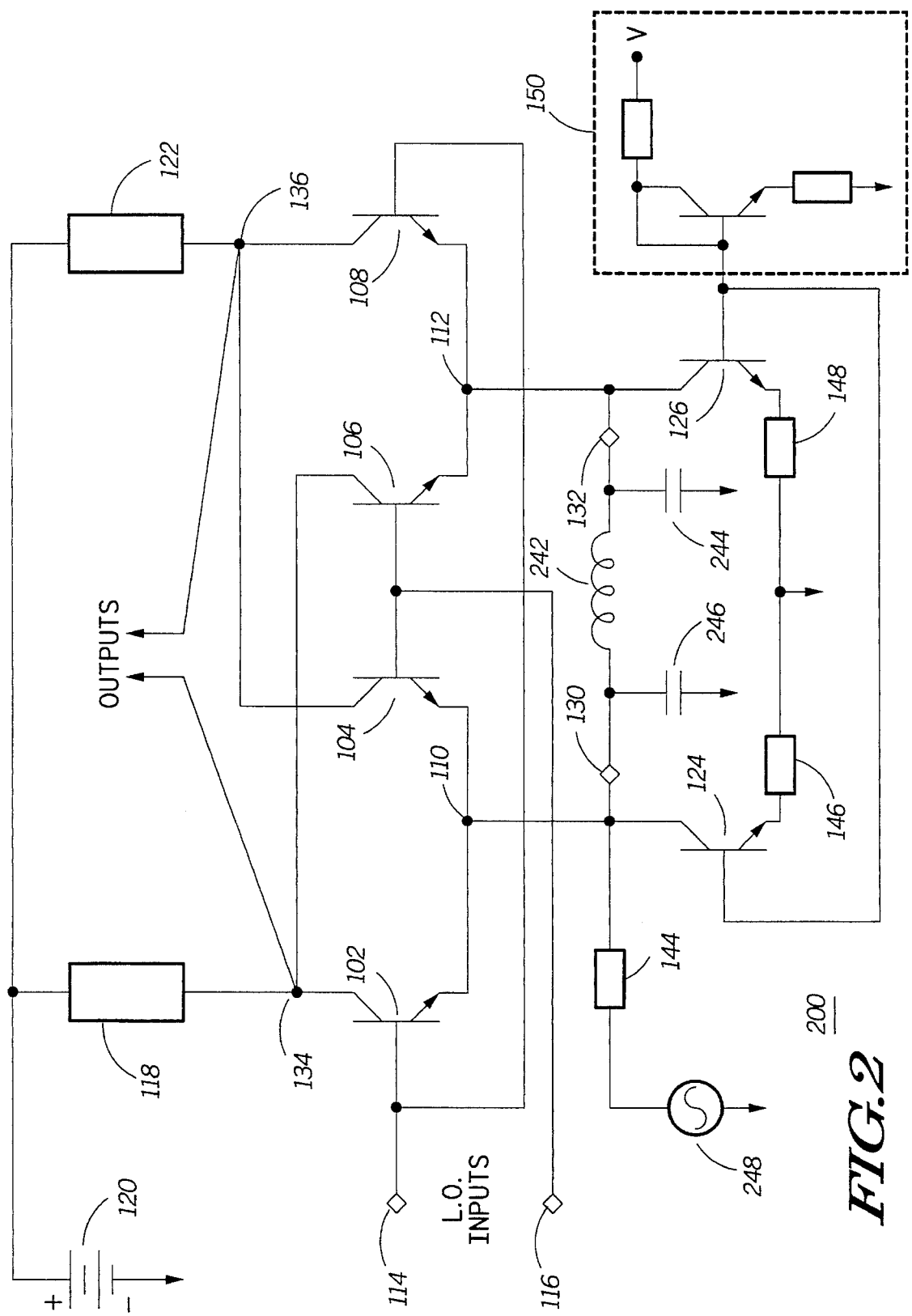
FIG. 2 is a schematic diagram of the collector-injection mixer circuit in accordance with an alternative embodiment of the present invention.

The modulation occurs as a result of changing the voltage at the coupled emitters of the upper pairs instead of converting the RF signal voltage to a non-linear current. The lower pair transistors act as current mirrors and collector-injection transistors. The circuit therefore exhibits more gain and better signal-to-noise ratio than a common-base type mixer, and improved intermodulation performance over a common-emitter or a common-base type double-balanced mixer Referring to FIG. 2, a collector-injection mixer circuit 200 of an alternative embodiment of the present invention is shown. The collector-injection mixer circuit 200 operates similarly to the collector-injection mixer circuit 100 of FIG. 1 but for the RF signal from RF signal source 248 input circuit. Operationally, a single-ended signal 248 goes through a source impedance 144 and into a single-ended to differential transformer circuit coupled between terminals 130 and 132 which transforms the single-ended signal into a differential signal. The single-ended to differential transformer circuit comprises an inductor 242, and two capacitors 244, 246, each connected on either ends of the inductor and ground. At a desired frequency of operation, the single ended to differential transformer circuit is designed such that the reactances of the capacitors 244, 246 are equal to one-half the reactance of the inductor 242 causing the single ended to differential transformer circuit to be resonant such that the voltage at node 130 will be in phase opposition to the voltage at node 132.

Accordingly, the invention provides a mixer circuit that shows improved intermodulation behavior over known common-base or common-emitter double-balanced topologies, and a mixer circuit that can demonstrate the improved behavior when operating from a supply voltage of one (1) volt. The collector-injection mixer described exhibits improved linearity due to the fact that the radio frequency signal is not applied to a voltage-to-current conversion stage prior to the mixing with the local oscillator signal but is differentially applied to the collectors of the lower differential pair of transistors.

The modulation occurs as a result of changing the voltage at the coupled emitters of the upper pairs instead of converting the RF signal voltage to a non-linear current. The lower pair transistors act as current mirrors and collector injection transistors. The circuit therefore exhibits more gain and better signal-to-noise ratio than a common-base type mixer, and improved intermodulation performance over a common-emitter or a common-base type double-balanced mixer.

The invention described shall not be limited in scope to the embodiment described. In the embodiment described, the transistors are of NPN types. It is obvious that PNP types transistors may alternatively be used. Also, field effect transistors may be used, in which case emitter, collector and base in the present application should be changed to source, drain and gate respectively.

What is claimed is:

1. A collector-injection mixer circuit comprising:

a first differential pair of transistors comprising first and second transistors having emitters connected to a common first emitter terminal;

a second differential pair of transistors comprising third and fourth transistors having emitters connected to a common second emitter terminal;

a first and second common base terminals for receiving a mixing signal, the first common base terminal coupled to bases of the first and fourth transistors, and the second common base terminal coupled to bases of the second and third transistors;

a third differential pair of transistors comprising fifth and sixth transistors having collectors respectively connected to first and second input signal-terminals for receiving an input signal, the collector of the fifth transistor further connected to the first emitter terminal, the collector of the sixth transistor further connected to the second emitter terminal, and the fifth and sixth transistors having bases connected to a third common base terminal for receiving a reference current;

a first and second resistors each respectively coupled between ground and emitters of the fifth and sixth transistors; and first and second output terminals for providing output signals of the collector-injection mixer circuit, the first output terminal coupled to collectors of the first and third transistors, and the second output terminal coupled collectors to the second and fourth transistors.

2. The collector-injection mixer circuit as claimed in claim 1, further comprising a transformer having a primary winding and a secondary winding, the primary winding having a pair of terminals coupled to an input signal source, the secondary winding being coupled to the collectors of the fifth and sixth transistors for providing a differential input signal thereto.

3. The collector-injection mixer circuit as claimed in claim 1, further comprising a single-ended to differential transformer circuit having an input coupled to an input signal source and an output coupled to the collectors of the fifth and sixth transistors for providing a differential input signal thereto.

4. The collector-injection mixer circuit as claimed in claim 1, in which at least one transistor is a field effect transistor having a source, drain and gate electrode which respectively serves as the emitter, collector and base of such transistors.

5. A collector-injection mixer circuit comprising:

a first differential pair of transistors comprising first and second transistors having emitters connected to a common first emitter terminal;

a second differential pair of transistors comprising third and fourth transistors having emitters connected to a common second emitter terminal;

a first and second common base terminals for receiving a mixing signal, the first common base terminal connected to bases of the first and fourth transistors, and the second common base terminal connected to bases of the second and third transistors;

a third differential pair of transistors comprising fifth and sixth transistors having collectors respectively connected to first and second input signal terminals for receiving a differential input signal via a transformer, the collector of the fifth transistor further connected to the first emitter terminal, the collector of the sixth transistor further connected to the second emitter terminal, and the fifth and sixth transistors having bases connected to a third common base terminal for receiving a reference current wherein the transformer comprises a primary winding and a secondary winding, the primary winding having a pair of terminals coupled to an input signal source, and the secondary winding being coupled to the collectors of the fifth and sixth transistors for providing the differential input signal thereto;

a first and second resistors each respectively coupled between ground and emitters of the fifth and sixth transistors; and a first and second output terminals for providing output signals of the collector injection mixer circuit, the first output terminal coupled to collectors of the first and third transistors, and the second output terminal coupled to collectors of the second and fourth transistors.

6. A collector-injection mixer circuit comprising:

a first differential pair of transistors comprising first and second transistors having emitters connected to a common first emitter terminal;

a second differential pair of transistors comprising third and fourth transistors having emitters connected to a common second emitter terminal;

a first and second common base terminals for receiving a mixing signal, the first common base terminal connected to bases of the first and fourth transistors, and the second common base terminal connected to bases of the second and third transistors;

a third differential pair of transistors comprising fifth and sixth transistors having collectors respectively connected to first and second input signal terminals for receiving a differential input signal via a single-ended to differential transformer circuit, the collector of the fifth transistor further connected to the first emitter terminal, the collector of the sixth transistor further connected to the second emitter terminal, and the fifth and sixth transistors having bases connected to a third common base terminal for receiving a reference current emitter of the sixth transistor being coupled through a resistor to ground, and bases of the fifth and sixth transistors being coupled to a reference current wherein the single-ended to differential transformer includes an input coupled to an input signal source and an output coupled to the collectors of the fifth and sixth transistors for providing the differential input signal thereto; and a first and second resistors each respectively coupled between ground and emitters of the fifth and sixth transistors; and a first and second output terminals for providing output signals of the collector-ejection mixer circuit, the first output terminal coupled to collectors of the first and third transistors, and the second output terminal coupled to collectors of the second and forth transistors.

* * * * *

UNITED STATES PATENT AND TRADEMARK OFFICE
CERTIFICATE OF CORRECTION

PATENT NO. : 5,521,545
DATED : May 28, 1996
INVENTOR(S) : Terry et al.

It is certified that error appears in the above-indentified patent and that said Letters Patent is hereby corrected as shown below:

Claim 1, column 4, line 43, delete "a" before the word first.

Claim 5, column 5, line 24, delete the first appearance of "a".

Claim 5, column 6, line 1, delete the first appearance of "a".

Claim 6, column 6, line 14, delete the first appearance of "a".

Claim 6, column 6, line 30, delete "emitter of the sixth transistor being coupled through a resistor to ground, and bases of the fifth and sixth transistors being coupled to a reference current".

Signed and Sealed this

Twelfth Day of November, 1996

Attest:

BRUCE LEHMAN

*Attesting Officer*   *Commissioner of Patents and Trademarks*